United States Patent [19]

Cottrell et al.

[11] Patent Number: 4,626,882
[45] Date of Patent: Dec. 2, 1986

[54] TWIN DIODE OVERVOLTAGE PROTECTION STRUCTURE

[75] Inventors: Peter E. Cottrell, Essex Junction; William J. Craig, South Burlington; Ronald R. Troutman, Essex Junction, all of Vt.

[73] Assignee: International Business Machines Corporation, Armonk, N.Y.

[21] Appl. No.: 632,098

[22] Filed: Jul. 18, 1984

[51] Int. Cl.$^4$ ............................................. H01L 29/78
[52] U.S. Cl. .................................. 357/23.13; 357/48; 357/42; 357/13
[58] Field of Search .................... 357/22.13, 48, 42

[56] References Cited

U.S. PATENT DOCUMENTS

| | | | |
|---|---|---|---|
| 3,667,009 | 5/1972 | Rugg | 357/23.13 |
| 3,673,428 | 6/1972 | Athanas | 357/23.13 |
| 3,712,995 | 1/1973 | Steudel | 357/23.13 |
| 3,748,547 | 7/1973 | Sugimoto | 357/23 |
| 3,934,159 | 1/1976 | Nomiya et al. | 307/304 |
| 3,948,694 | 4/1976 | Mills, III | 148/187 |
| 3,967,295 | 6/1976 | Stewart | 357/23.13 |
| 4,117,507 | 9/1978 | Pacor | 357/48 |
| 4,405,934 | 9/1983 | Sloan | 357/15 |

Primary Examiner—Martin H. Edlow
Assistant Examiner—Terri M. Henn
Attorney, Agent, or Firm—Mark F. Chadurjian; George Tacticos

[57] ABSTRACT

Disclosed is an overvoltage protection structure which when used with CMOS circuits it protects them from overvoltage conditions while minimizing latch-up conditions in the structure. It consists of a well region of an opposite conductivity to that of the substrate defining a pocket region having a conductivity type which is similar to that of the substrate. A first PN junction diode is formed in a portion of the well region and a second PN junction diode is formed in the pocket region. The two diodes have opposite polarity and they both are connected to a signal line in such a way that one of the two diodes will be forward biased if the voltage on the signal line exceeds the bounds of the power supply voltages. The pocket region is connected to a $V_{SS}$ terminal which is normally grounded and the well region is connected to a power supply $V_{DD}$. The doping concentration in the well region is predetermined to have a gradient so that minority carriers injected from one of the diodes in the well region will be repulsed and prevented from moving into the substrate region where they would be majority carriers and they could cause latch-up in the structure or at the very least adversely affect the voltage level of the substrate. Instead the injected carriers recombine in the well region or are collected by the adjacent isolated pocket region.

When the second diode is forward biased, the minority carriers are injected into the isolated pocket region and are prevented from reaching the substrate by the underlying well region. This prevents these carriers from affecting the operation of adjacent circuits.

9 Claims, 3 Drawing Figures

TWIN DIODE OVERVOLTAGE PROTECTION STRUCTURE

DESCRIPTION

1. Field of the Invention

The present invention relates to overvoltage protection structures, and more particularly to twin diode overvoltage protection structures adapted for use with Complementary MOS (CMOS) circuits.

2. Related Application

In a co-pending U.S. patent application Ser. No. 541,922, filed on Oct. 14, 1983, entitled "CMOS Structure Including A Buried Collector for Minimizing Latch-Up" by F. F. Fang et al and assigned to the same assignee as the present Application, there is disclosed and claimed an improved CMOS structure which includes a buried collector region to minimize latch-up.

In a co-pending U.S. patent application Ser. No. 640,421, filed on Aug. 13, 1984, entitled "Charge Pumping Structure For A Substrate Bias Generator", by the inventors of the present application and assigned to the assignee of the present application, there is disclosed and claimed an improved charge pumping structure having a first PN junction diode and an isolation ring for inhibiting minority carrier injection into the substrate and a second PN pocke diode which inhibits the undesired flow of majority carriers into the substrate.

BACKGROUND OF THE INVENTION

Semiconductor devices, such as MOS and CMOS integrated circuits, are often damaged by relatively large voltage transients due to Electrostatic Discharge (ESD) and to various spurious high voltage signals. To prevent such failures there is a need for effective protective devices at all MOS inputs. To meet this need, a variety of such protection devices have been suggested and used, such as Zener diodes, forward biased diodes, and MOS transistors.

U.S. Pat. No. 3,748,547 issued on July 24, 1973 to E. Sugimoto teaches the use of a protection PN junction diode connected in parallel with the gate electrode of an FET to protect the gate insulator of the FET in the event that a high voltage pulse is applied to the signal input electrode of the FET.

An article by D. Alameddine, entitled "Protective Circuit for Integrated Semiconductor Devices", published in the *IBM Technical Disclosure Bulletin*, Vol. 20, No. 10, pages 3962-3963, March 1978, describes another arrangement for protecting the gate inputs of FET circuits and the inputs of bipolar devices. It consists of a double chain of antiparallel diodes having one common pole connected to the input to be protected and another common pole connected to the ground.

CMOS circuits are also susceptible to an undesired SCR action commonly known as "latch-up" which if not controlled can lead to the destruction of the device, or its metal traces, by excessive current flow. This susceptibility is due to the existence within the commonly available CMOS circuits of parasitic PNPN structures. Under certain conditions, such as the presence of a transient signal, one of the PN junctions can be forward biased which can turn-on the SCR action. The device then remains "on" in a latch-up state even after the signal which causes the forward biasing of the PN junction is removed. There have been many efforts to eliminate latch-up in such devices or at the very least to minimize the effects of latch-up on them. Some of these are focused on eliminating latch-up through various fabrication techniques, such as through the use of a dielectric insulator to eliminate the formation of the parasitic bipolar transistors in the devices. Other techniques suggested include the formation of doped regions to reduce the current passage between the parasitic transistors and to reduce their DC current amplification factor.

Thus, CMOS structures are particularly vulnerable to the presence of overvoltage conditions at their input electrodes because such conditions not only can damage the structure's gate dielectric regions but they may also cause a damaging SCR action in the structure. The prior art overvoltage protection structures typically absorb some of these high voltage transient pulses by conducting current into an inactive portion of the substrate. However, such structures may protect the gate dielectric regions of the CMOS structures but occasionally they result in the damage of the structure they protect by creating latch-up conditions in them. For example, the current flowing into the substrate through a protection structure quite often is sufficient to trigger parasitic vertical PNP and lateral NPN transistors to enter into a latch-up condition.

In U.S. Pat. No. 3,934,159 there is shown an IGFET structure having a protective diode designed to avoid the injection of minority carriers into the substrate. However, the particular structure described therein protects the FET devices from overvoltage conditions of a single predetermined polarity. The twin diode protection circuits currently known (such as the one shown in the May/June 1982 issue of "VLSI Design") provide ESD protection but they do not adequately protect the integrated circuits into which they are incorporated from the affects of injections into the common substrate of majority and minority carriers.

SUMMARY OF THE INVENTION

The general purpose of this invention is to provide a new and improved overvoltage protection structure which when it is connected to a signal line of a CMOS arrangement it will protect the structure in the presence of overvoltage conditions while minimizing the injection into a common substrate of majority or minority carriers thus reducing the chances for latch-up and avoiding the discharge of the common substrate which may need to remain at a predetermined voltage level.

To accomplish this purpose we have provided a semiconductor body of a first conductivity type in which a first region of a second conductivity type is formed in a predetermined portion of this body containing therein a island-like second region having a first conductivity type. A first diode forming region of a second conductivity type is disposed in a portion of the second region and a second diode forming region of a first conductivity type is formed in a portion of the first region. There are also means for applying a first potential to said first region and means for applying a second potential to said second region and means for connecting the signal line to the first and second diode forming regions.

During operation and when a temporary overvoltage condition of either polarity is applied at the signal line it will cause the injection of minority carriers into either the island-like second region or into the first region depending on whether the polarity of the voltage on the signal line is of the type that can cause the forward biasing of the first or the second diode. In either event these minority carriers will be substantially inhibited from moving into the portion of the semiconductor body of the first conductivity type which is outside the first region.

For CMOS structures constructed in an epitaxial layer formed on a semiconductor substrate, the structure of the present invention may be constructed in the epitaxial layer with the first region extending into the substrate portion adjacent the epitaxial layer-substrate interface.

Among the many advantages provided by this invention is the protection of devices connected to a common signal line from overvoltage conditions of either polarity.

Another advantage is that it provides such overvoltage protection without causing latch-up in the structure.

A further advantage of this invention is that it can be incorporated in a CMOS structure to protect the inputs of the structure from overvoltage conditions and it can accomplish this without causing any current leakage from the substrate that is normally charged to a predetermined voltage level by an on-chip substrate voltage generator.

The invention and its advantages will become more readily apparent in the following description taken in conjunction with the accompanying drawings.

DESCRIPTION OF THE PREFERRED EMBODIMENTS

Figure 1:
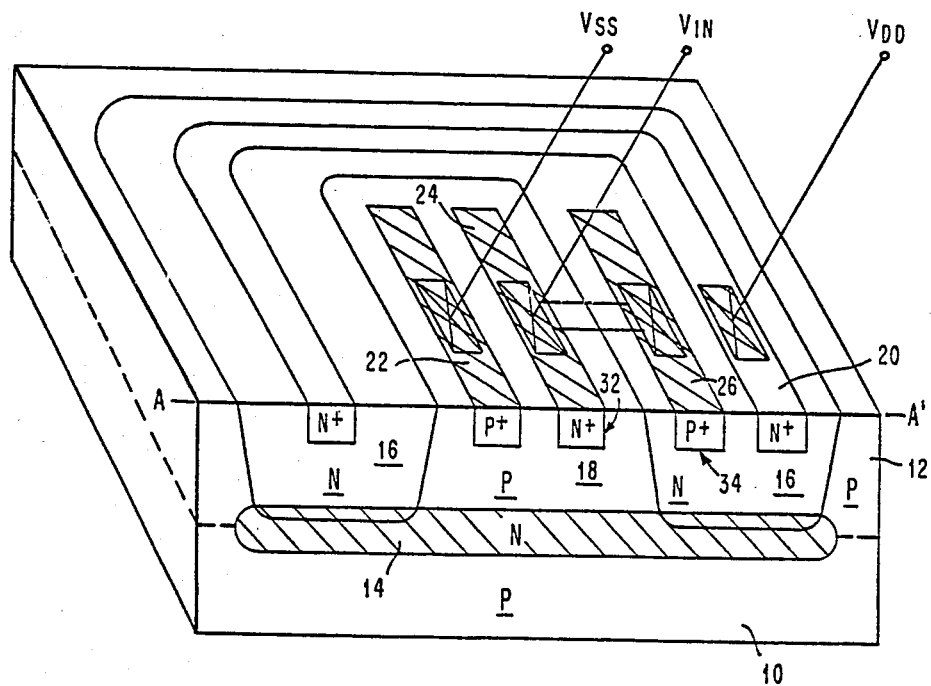
FIG. 1 illustrates a perspective view of an overvoltage protection structure in accordance with the present invention.

Referring now to FIG. 1, there is illustrated a structure constructed in accordance with the teachings of the present invention. The structure includes a P substrate 10 on which there is a P epitaxial layer 12. An N type buried layer 14 is formed in a portion of substrate 10 and extending into the epitaxial layer 12. Such a layer can be constructed by first forming an N layer into the substrate prior to the formation of the epitaxial layer and causing during an annealing step, N type dopants to out-diffuse from the N type layer in the substrate into the epitaxial layer. A N well region 16 is formed in the epitaxial layer 12 in such a way so that this N region extends through a portion of the epitaxial layer to reach the buried layer 14 and thus the combination of the N well and the N type buried layer define an island-like P type region 18 which is surrounded by N type material. The combination of the buried layer 14 and the well region 16 may be formed as provided above or in any other way so long as they establish a continuous N type first region to define a P type second region in the epitaxial layer which is isolated by the N type material from the remaining P type portion of the epitaxial layer and the substrate. Buried layer 14 should have a doping concentration which is relatively higher than that of well region 16. For example, the buried layer 14 may have a doping concentration of $5 \times 10^{16}$ atoms/cm$^3$ or more while the N well region 16 may have a N type doping concentration of $2 \times 10^{16}$ atoms/cm$^3$. By way of example, the P type region 18 may have a doping concentration in the range of $10^{14}$ to $10^{18}$ atoms/cm$^3$. An N+ type region 24 is formed either through diffusion or ion implantation in a predetermined portion of P type region 18 forming a PN junction diode 32 therewith. A P+ type region 26 is formed in a portion of region 16 through known doping techniques such as diffusion or ion implantation, to form a second PN junction diode 34 therewith. Regions 24 and 26 are both connected to signal line $V_{IN}$. Contact regions 20 and 22 are likewise provided for the N well region 16 and the P island-like region 18 respectively. The N well region 16 is connected to power supply $V_{DD}$ and the island-like region 18, which is often referred to as a pocket region, is connected to power supply $V_{SS}$ which is typically at the ground potential. The N+ regions may have a doping concentration greater than $10^{19}$ atoms/cm$^3$ and the P+ regions may also have a doping concentration greater than $10^{19}$ atoms/cm$^3$.

Figure 2:
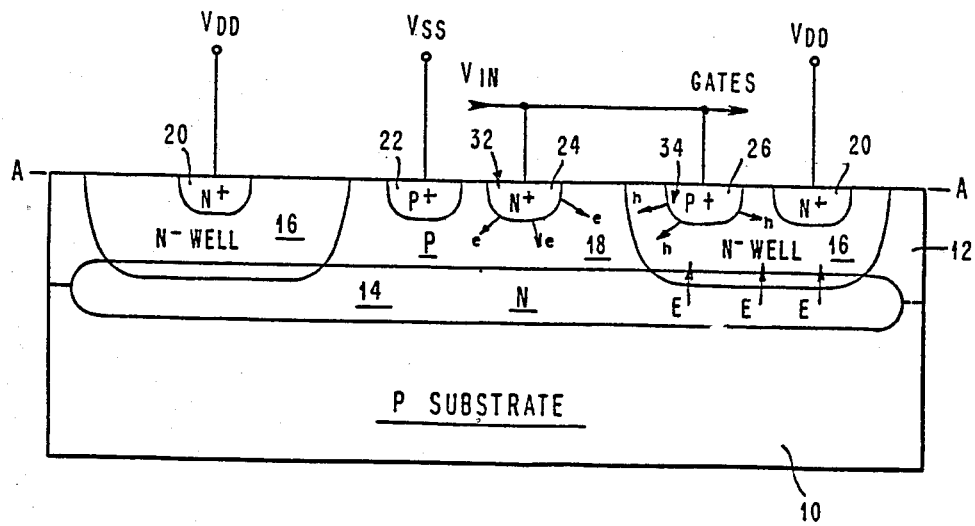
FIG. 2 illustrates a sectional view taken substantially along the plane designated by the line AA' of FIG. 1.

Referring now to FIG. 2, there is shown a cross sectional view of the structure depicted in FIG. 1 substantially along the plane designated by the line AA' of FIG. 1. It includes illustrations on how holes and electrons move under certain bias conditions and how the layout of the structure depicted in FIGS. 1 and 2 is suited to avoid latch-up, to prevent the injection of minority charge carriers into the substrate and to avoid a charge draining out of the substrate. During operation and when an overvoltage condition is applied on the signal line, one of the two diodes of the protection structure will be forward biased. For example, when $V_{IN} > V_{DD}$ (where power supply $V_{DD}$ is typically set at about 5.0 volts) diode 34 which is formed by regions 26 and 16, will be forward biased. This causes holes (h) to be injected from P+ region 26 to N type well region 16 where some of them will stay within region 16 and will recombine with electrons in the N well region 16 or the N+ contact region 20 while others will diffuse into P type region 18 and once there they will drift towards the P+ contact 22 which is connected to $V_{SS}$ which is typically tied to ground. The holes in the N well region 16 which will move towards the buried layer 14 will be repulsed by electric field (E) which is built into the structure by the difference in the N type doping concentrations that was preselected for layer 14 (i.e. greater or equal to $5 \times 10^{16}$ atoms/cm$^3$) from that for layer 16 (i.e. $2 \times 10^{16}$ atoms/cm$^3$). The E-field will prohibit many holes in region 16 from moving into buried layer 14 and through it into P type substrate 10. Region 14 was designed to have a higher doping concentration that region 16 for this particular reason, that is, in order to create a potential barrier which will prevent the movement of holes into the P type substrate. Region 26 should also be in close proximity to region 18 so that as many of the holes as possible will reach region 18 and be prevented from reaching substrate 10. Once holes reach pocket region 18 they are collected there and will ultimately end in contact region 22 from where they will drain out through $V_{SS}$. Of course regions 26 and 18 cannot be so close as to result in a "punch-through" which will electrically short regions 26 and 18. Thus, the combination of P pocket region 18, N well region 16 and N type buried layer 14 make it possible to divert the flow of holes away from the P type substrate 10 during one type of an overvoltage condition at $V_{IN}$. The injection of holes into the P type substrate is undesirable primarily for two reasons. Since holes are majority carriers in this type of a substrate, their movement in this resistive medium will cause a voltage drop in the substrate which under certain conditions may be enough to give a parasitic PNP transistor sufficient gain to cause latch-up in the structure. Furthermore, since some CMOS arrangements require their substrate potential to be at a negative level, typically within a range of −1 to −3 volts, and for this purpose they provide for an on-chip substrate bias generator, it would be counterproductive to allow the injection of holes into the substrate since these positive charges will have to be neutralized by the addition of negative charges by the charge pump of the substrate bias generator.

When $V_{IN}$ is at a voltage level between $V_{DD}$ and $V_{SS}$ (a range which typically should be between 0 and +5.0 volts) then there is no overvoltage condition from which to protect the structure since this is the typical $V_{IN}$ signal voltage range for many CMOS devices.

When $V_{IN}$ is less than $V_{SS}$, then diode 32 is forward biased resulting in the injection of electrons into P region 18. Some of these electrons will be collected by the P+ contact region 22 and recombine with holes there while others will pass through region 18 and be collected by the N well region 16 or N type buried region 14 and then through these regions move to the N+ contact region 20. The injection of electrons into the substrate is undesirable because the electrons can move from there into an active device region where they can adversely affect its performance.

Thus, wherever the ESD or spurious voltage conditions cause the voltage level at $V_{IN}$ to go outside the normal operating range of the structure and regardless of whether $V_{IN}$ reaches levels over $V_{DD}$ or less than $V_{SS}$, the structure will avoid the injection of majority or minority charges into the substrate. This invention makes it possible to isolate such charges and to drain or neutralize them through off-chip power supplies, such as the $V_{DD}$, or $V_{SS}$ without significantly affecting the voltage level of the substrate which may be set at a preselected voltage level.

In the embodiment shown in FIGS. 1 and 2 the substrate 10 is shown as P, the epitaxial layer as P and the pocket region 18 as P. However, an embodiment in accordance with the teachings of the present invention may also be constructed in a P+ or a P− type substrate on which there may also be a P or a P− type epitaxial layer. The pocket region 18 may also be either a P or a P− region. Furthermore the invention may also be practiced with an N type substrate where every region or layer that was a P type region or layer in the discussions above will be an N type region or layer.

A structure may also be constructed in accordance with the teachings of the present invention wherein there are two adjacent epitaxial layers on a surface of a substrate with a buried layer formed around the interface separating the two epitaxial layers and the well region extending through the top epitaxial layer and merging into the buried layer.

Figure 3:
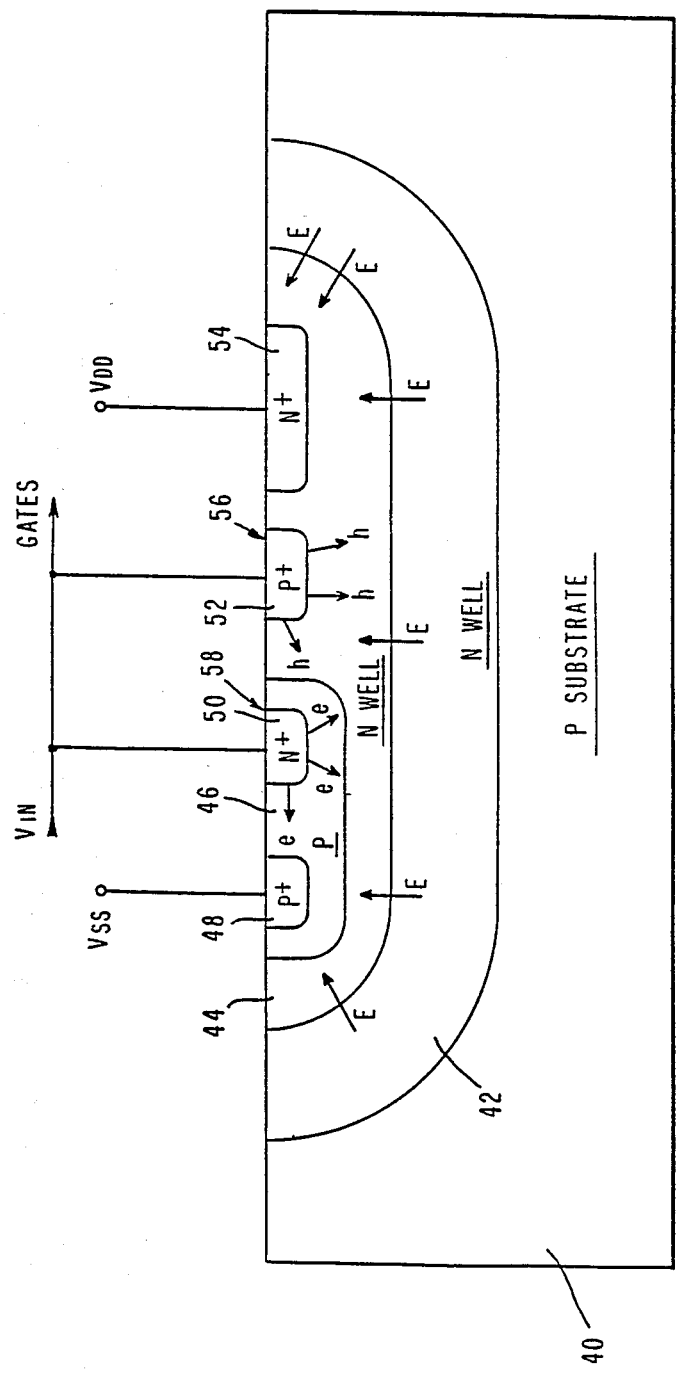
FIG. 3 illustrates a sectional view of another embodiment of this invention.

Referring now to FIG. 3, there is shown a P type substrate 40 in which there is a first N type well region 42. This well region may be formed through ion implantation whereby a predetermined portion of the P type substrate is subjected to ion implantation with an N type conductivity determining impurity until this particular portion reverts to a N type well region of a predetermined conductivity. Region 44 depicts a second well region in a preselected portion of first well region 42 which is made to have a lower concentration of N dopants than region 42 either by the selective implantation of region 42 with P type conductivity determining ions in order to compensate for some of the N type dopants in it or by making this region to have a small N type conductivity during the original formation of the N well region 42. An isolated P region 46 is formed in the N region 44 and an N+ diode forming region 50 and a P+ contact region 48 are formed inside region 46. The reason for providing this grading of the two adjacent N type well regions with different doping concentration is in order to create a built-in electric field (E) all around the second well region 44 to repulse the holes (h) in region 44 from moving into the P type substrate 40 during the forward biasing of diode 56, when $V_{IN}$ is greater than $V_{DD}$. The typical values for doping concentrations are similar to those mentioned in connection with regions 14 and 16 of the embodiment of FIG. 2. That is, the N type dopant concentration for region 44 may be selected to be about $5 \times 10^{16}$ atoms/cm$^3$ or more and for region 42 about $2 \times 10^{16}$ atoms/cm$^3$. The P type region 46 may be made to have a P type doping concentration in the range between $10^{14}$ to $10^{18}$ atoms/cm$^3$. N+ region 54 is a contact region for N region 44 for the connection of power supply $V_{DD}$. Thus the holes injected from region 52 will either recombine with electrons within regions 44 and 42 or be collected at N+ region 54 or diffuse into isolated P type region 46 and through it be collected and drained out through P+ contact 48 which is connected to $V_{SS}$ which is normally tied to ground. Similarly when $V_{IN}$ is less than $V_{SS}$, PN junction diode 58 is forward biased resulting in the injection of electrons into pocket region 46 but because of the presence of the existence of the N regions 44 and 42 they will be prevented from reaching the P type substrate 40. Instead they will either recombine with holes within the isolated pocket P region 46 or contact region 48 or be collected by N regions 44 and 42 and transported to contact region 54.

While the invention has been described in connection with preferred embodiments it will be understood that it is not intended to limit the invention to those embodiments, or the final structures depicted in the drawings. On the contrary, it is intended to cover all alternatives, modifications and equivalents, as may be included within the spirit and scope of the invention as defined by the appended claims.

What is claimed is:

1. An overvoltage protection structure connected to a signal line of a semiconductor structure comprising:
   a semiconductor body of a first conductivity type;
   a first region of a second conductivity type formed in a predetermined portion of said body;
   a second region of said first conductivity type formed totally within said first region and separated from said body by a portion of said first region;
   a first diode forming region of said first conductivity type formed in said first region;
   a second diode forming region of said second conductivity type formed in said second region;
   means for applying a first power supply voltage at a first potential to said first region;
   means for applying a second power supply voltage at a second potential to said second region; and
   means for connecting said signal line to said first and said second diode forming regions.

2. An overvoltage protection structure as set forth in claim 1 wherein said first region comprises a first portion which has a first concentration of conductivity determining impurities and a second portion which has a second concentration of conductivity determining impurities, said second concentration being greater than said first concentration.

3. An overvoltage protection structure as set forth in claim 2 wherein:
said means for applying a first potential to said first region comprises a first contact region in said first region, first ohmic contact means on said contact region and a first power supply coupled to said first ohmic contact means; and
said means for applying a second potential to said second region comprises a second contact region in said second region, second ohmic contact means on said second contact region and a second power supply coupled to said second ohmic contact means.

4. An overvoltage protection structure as set forth in claim 2 wherein:
said first conductivity type semiconductor body is a first conductivity epitaxial layer formed on a semiconductor substrate of a first conductivity type.

5. An overvoltage protection structure as set forth in claim 2 wherein said second portion of said first region is adjacent said semiconductor substrate.

6. An overvoltage protection structure connected to a signal line of a semiconductor device comprising:
a semiconductor substrate of a first conductivity type;
a first well region of a second conductivity type formed in a predetermined portion of said substrate;
a second well region of a second conductivity type formed in a predetermined portion of said substrate and extending into said first well region wherein the doping concentration and said second well region is lower than that of said first well region;
an isolated region of a first conductivity type surrounded by said second well region wherein said isolated region is isolated from the remaining portion of said substrate by said first well region;
a first diode forming region of a second conductivity type formed within said isolated region;
a second diode forming region of a first conductivity type formed with said second well region;
means for connecting said second well region to a low bias voltage means;
means for connecting said isolated region to a high bias voltage means;
means for connecting said signal line to said first and said second diode forming regions.

7. A semiconductor structure comprising:
a semiconductor body of a first conductivity type;
a first well region of a second conductivity type formed in a portion of said body and having in it a second conductivity type dopant of a predetermined concentration;
a second well region of a second conductivity type formed in a portion of said body within said first well region wherein the second conductivity type dopant concentration in said second well region is lower than that of said first well region;
an isolated region having a first type of conductivity formed within said second well region, said isolated region being isolated from remaining portions of said body by said second well region;
a second conductivity type region formed within said isolated region so that it forms a first PN junction diode;
a first conductivity type region formed within said second well region so as to form a second PN junction diode;
means for connecting said second conductivity type portion of said first PN junction diode and said second conductivity portion of said second PN junction diode to a signal line to receive a varying voltage signal;
means for applying a high bias potential on said second well region, said second PN junction diode being placed into a conductive state when said varying voltage signal rises above said high bias potential, said first conductivity type region generating minority carriers that are prevented from penetrating into said body by said first well region and said second well region; and
means for applying a low bias potential on said isolated region, said first PN junction diode being placed into a conductive state when said varying voltage signal falls below said low bias potential, said second conductivity type region generating minority carriers that are prevent from penetrating into said body by said first well region and said second well region.

8. A semiconductor structure as set forth in claim 7 wherein:
said semiconductor body is a P type semiconductor substrate;
said first well region is a first N-well region.
said second well region is a second N-well formed within said first N-well wherein the concentration of the N-type dopants in said first well region is greater than that of said second well region;
said isolated region is a P type region formed in said second N-well region;
said second conductivity type region in said isolated region is an N-type region formed in the P-type isolated region so as to form a first PN junction diode; and
said first conductivity type region in said second well region is a P-type region formed in the second N-well region so as to form a second PN junction diode.

9. A semiconductor structure as set forth in claim 8 wherein:
said first bias potential is set at a predetermined positive supply potential; and
said first bias potential is the ground potential.

* * * * *